United States Patent [19]

Pasch et al.

[11] Patent Number: 4,652,134
[45] Date of Patent: Mar. 24, 1987

[54] MASK ALIGNMENT SYSTEM

[75] Inventors: Nicholas F. Pasch, Mt. View; James L. Hubbard, San Jose, both of Calif.

[73] Assignee: LSI Logic Corporation, Milpitas, Calif.

[21] Appl. No.: 645,871

[22] Filed: Aug. 28, 1984

[51] Int. Cl.⁴ ............................................. G01B 11/26
[52] U.S. Cl. ..................................................... 356/401
[58] Field of Search ............... 356/357, 361, 363, 399, 356/400, 401

[56] References Cited

U.S. PATENT DOCUMENTS

| | | | |
|---|---|---|---|
| 3,718,396 | 2/1973 | Hennings | 356/399 |
| 3,988,066 | 10/1976 | Suzuki et al. | 355/78 |
| 4,083,634 | 4/1978 | Momose et al. | 355/71 |
| 4,315,201 | 2/1982 | Suzuki et al. | 250/557 |
| 4,425,037 | 1/1984 | Hershel et al. | 356/401 |
| 4,500,615 | 2/1985 | Iwai | 356/357 |

OTHER PUBLICATIONS

Chwalow et al., IBM Technical Disclosure Bulletin, vol. 17, No. 3, 8/1974, p. 866.
Harper et al., IBM Technical Disclosure Bulletin, vol. 13, No. 4, 9/1970, p. 1028.

Primary Examiner—F. L. Evans
Attorney, Agent, or Firm—Alan H. MacPherson; Steven F. Caserza; Richard Franklin

[57] ABSTRACT

A system for aligning a semiconductor wafer with a mask bearing a pattern to be formed on the wafer, in which both the wafer and the mask bear an alignment mark, and in which light used for alignment is filtered to transmit only in a selected bandwidth, uses a reflector system to gather light reflected from edges of the alignment mark on the wafer. In order to minimize the effect of erroneous alignment signals from standing waves generated when the alignment signal is reflected from a wafer coated with a layer of photoresist, a second filter is placed in the path of light after it has reflected from the target. This second filter transmits a range of the reflected light which does not produce standing waves.

6 Claims, 11 Drawing Figures

MASK ALIGNMENT SYSTEM

BACKGROUND OF THE INVENTION

1. Field of the Invention

This invention relates to the fabrication of integrated circuit devices and in particular to an improved system and method for aligning the masks used during formation of patterned photoresist on an integrated circuit.

2. Description of the Prior Art

One processing step used in the fabrication of integrated circuits is a photolithographic step, where a semiconductor wafer is coated with a light sensitive photoresist. Using a mask, the photoresist is exposed to light in a pattern in order to prepare the photoresist for etch processes. One method for projecting an appropriate pattern is the use of a projection system such as the Ultratech Stepper Model 900 projection stepper. One type of mask used during photolithographic steps is a chromed glass or quartz plate bearing the image to be projected onto the integrated circuit. Light is projected onto the mask and those areas on the mask which are not chromed transmit the light, with chromed areas of the mask preventing transmission of light. The transmitted light is projected by a complex system of prisms and lenses so that a clear and accurate image of the pattern on the mask is projected onto a portion of the photoresist layer formed on the semiconductor wafer.

A simplified diagram of a projection stepper such as the Ultratech Model 900 is shown in FIG. 1. Light source 8 provides white light which is filtered to remove ultraviolet light. Light from light source 8 passes through light tunnel 7. Light tunnel 7 limits the light which passes through light tunnel 7 to those light rays which lens 9 can focus. The light passing through light tunnel 7 is controlled by actinic shutter 5 and high-speed shutter 6. Actinic shutter 5 does not block light, as does a conventional shutter. Instead, actinic shutter 5 allows light of a selected wavelength and/or pattern to pass. In the Ultratech Model 900, actinic shutter 5 passes only light having wavelengths within the range of 450 to 600 nanometers, and is thus used to limit the bandwidth of the light used for aligning mask 1 with wafer 4. Actinic shutter 5 is not used during the actual exposure of photoresist and thus the light from light source 8 is not limited in bandwidth during exposure of the photoresist. The light from light source 8 is focused by lens 9 toward mask 1 and prism unit 2. Mask 1 carries the desired pattern for exposing the photoresist on wafer 4. The patterned light provided by mask 1 is directed by prism unit 2. The light from prism unit 2 is focused on the area wafer 4 containing photoresist which is to be exposed with the image of mask 1.

Before exposing wafer 4 to the image on mask 1, the image on mask 1 must be properly aligned with wafer 4, so that components of the integrated circuit formed using the patterned photoresist produced by this photolithographic step will be properly aligned on wafer 4. During the alignment stage, high speed shutter 6 is opened and actinic shutter 5 remains closed. Actinic shutter 5 passes only light having wavelengths within the range of 450 nanometers to 600 nanometers. The light used in the alignment process must not expose the photoresist. Thus the light allowed to pass by actinic shutter 5 is limited to wavelengths having insufficient energy to cause the photoresist to chemically react. Therefore, the light provided through actinic shutter 5 has no effect on the photoresist on wafer 4.

An alignment target is a relief pattern on wafer 4 in a specific selected pattern. One example of an alignment target is shown in FIG. 2. For example, this relief area can be formed by polycrystalline silicon etched into a selected pattern. Alignment target 15 is used to align mask 1 with wafer 4, thereby insuring that components of the integrated circuit formed using the photoresist exposed during this photolithographic step are properly aligned.

Actinic shutter 5 includes a pattern which corresponds in shape to the shape of alignment target 15. With actinic shutter 5 closed and high-speed shutter 6 open, the pattern borne by actinic shutter 5 is projected onto an image on mask 1 of alignment target 15. The pattern projected by light source 8 through actinic shutter 5 is slightly larger than the image of alignment target 15 on mask 1, therefore the light transmitted from mask 1 has a pattern corresponding to an outline of alignment target 15.

This outline of the alignment target is projected by prism unit 2 onto reflector 10. A samll aperture 17 is provided in the center of concave reflector 10. The outline of the alignment target is reflected off reflector 10, through prism unit 2, and onto wafer 4. A diagram excluding prism unit 2 and isolating reflector 10 and wafer 4 is shown in FIG. 3. Reflector 10 is designed so that light waves reflected from prism 2 onto reflector 10, and from prism 2 onto wafer 4 and thus reflected from wafer 4 back to prism unit 2 strike reflector 10 at a right angle. As shown in FIG. 4, light from reflector 10 which is reflected by a flat portion of the surface of wafer 4 is reflected at an angle equal to the angle of incidence $\phi$. Therefore, light that is reflected from flat surfaces on wafer 4 does not enter aperture 17 (FIG. 1). However, light that strikes the edge of alignment target 15 as shown in FIG. 4 is scattered upon reflecting off the edge of alignment target 15. Some of the scattered light enters into aperture 17.

When the outline of the alignment target transmitted from mask 1 and reflected from reflector 10 is misaligned, for example as shown in FIG. 5a, very little of the light provided by the outline of the alignment target strikes the edges of alignment target 15. Therefore, very little light passes through aperture 17. Conversely, when the outline of the alignment target is properly aligned as shown in FIG. 5b, all of the edges of alignment target 15 are struck by light from the outline of the alignment target. Therefore, the light that passes through aperture 17 in reflector 10 is at peak intensity when the outline of the alignment target is properly aligned with alignment target 15.

Referring back to FIG. 1, the light that passes through aperture 17 is focused by lens 11 and passes through alignment target mask 12. A plan view of alignment target mask 12 is shown in FIG. 6. Alignment target mask 12 allows light to pass which conforms to the pattern of alignment target 15. The image projected through aperture 17 in reflector 10 is most intense in a pattern conforming to the shape of alignment target 15. Therefore, alignment target mask 12 confines the light passing through alignment target mask 12 to the pattern of alignment target 15. This helps insure that the light passing through the aperture of reflector 10 is reflecting from alignment target 15 and is not reflected from some other feature on wafer 4 which does not have a pattern conforming to alignment target 15. When the light reflected from reflector 10 strikes a pattern on wafer 4 which does not conform to alignment target 15, the light reflected from this pattern which passes through aperture 17 is an image which conforms to the other feature and not to the target. Alignment target mask 12 blocks enough of this light to prevent the erroneous reflected light from being perceived as a true alignment signal.

The light passing through alignment target mask 12 is focused by lens 13 onto photomultiplier tube 14. Photomultiplier tube 14 provides an electrical signal to alignment circuitry (not shown) proportional to the intensity of the light incident on photomultiplier tube 14. Thus, when the signal provided by photomultiplier tube 14 is at peak intensity, the image of alignment target 15 on mask 1 and alignment target 15 on wafer 4 are properly aligned.

Various phenomena can introduce error into the alignment system. A major source of error is standing waves of light which are generated in the photoresist on wafer 4. This phenomenon is particularly troublesome when the surface of wafer 4 is coated by unpatterned metalization which is covered by photoresist. When these standing waves occur, they cause spurious variations in the light intensity pattern of the alignment mask seen by photomultiplier tube 14.

FIG. 7a is a diagram depicting an ideal alignment signal as provided by photomultiplier tube 14 when mask 1 and wafer 4 are being aligned. The ideal alignment signal provides a clear peak when mask 1 and wafer 4 are properly aligned, as shown in FIG. 7a. FIG. 7b is a diagram depicting a typical alignment signal provided by photomultiplier tube 14 in FIG. 1 when photolithographic projection stepper 20 is aligning a wafer 4 which is coated by a metal layer covered with photoresist. The deviation of the signal in FIG. 7b from the ideal signal of FIG. 7a is caused by standing waves. The signal of FIG. 7b has not one peak as does the signal of FIG. 7a, but three peaks which leaves the computer of photolithographic projection stepper 20 guessing as to which peak, if any of the three, indicates proper alignment.

Others have attempted to control this phenomenon by limiting the light transmitted through actinic shutter 5 to frequencies of light which will not generate standing waves. For unknown reasons, this technique has proven to be ineffective.

SUMMARY

A photolithographic system designed in accordance with this invention includes a filter which limits an optical alignment signal to light within a selected frequency range, and also includes a filter which limits the light which has been reflected from a target on a wafer to be aligned thereby eliminating or minimizing extraneous light caused by standing waves. The filter is placed between the optical system generating the alignment signal, which indicates when proper alignment has been achieved between the photolithographic mask and the wafer which receives its photolithographic pattern from that mask, and the photosensitive device which receives the alignment signal.

DETAILED DESCRIPTION

Figure 1:
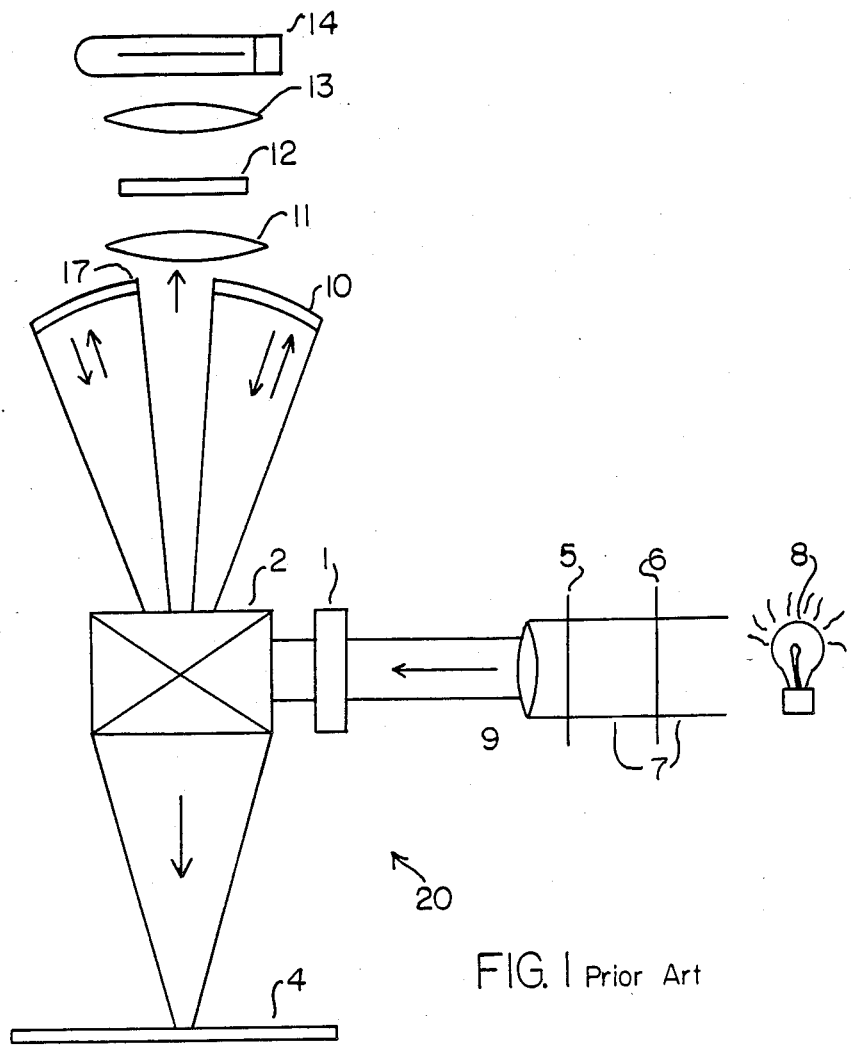
FIG. 1 is a diagram depicting a simplified photolithographic projection stepper machine.
Figure 2:
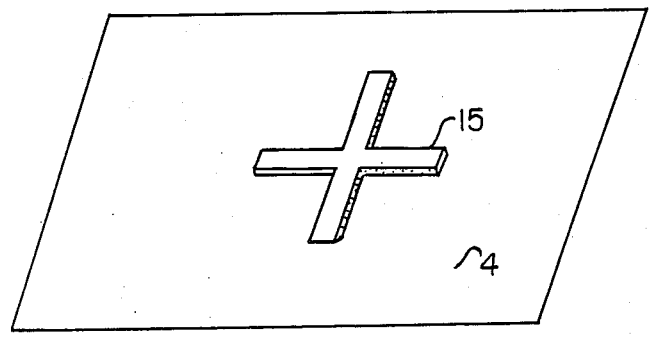
FIG. 2 is a drawing depicting an example of an alignment target.
Figure 3:
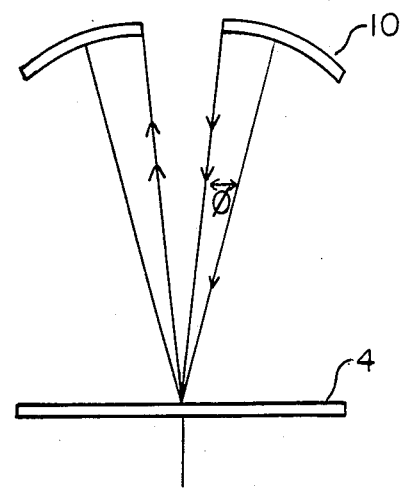
FIG. 3 is a diagram isolating the relationship between reflector 10 and wafer 4 of FIG. 1.
Figure 4:
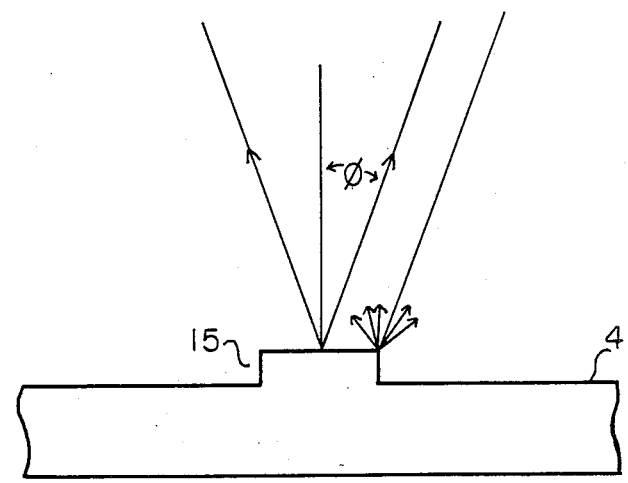
FIG. 4 is a diagram illustrating the effect of wafer 4 upon light waves incident upon wafer 4 and alignment target 15.
Figure 5A:
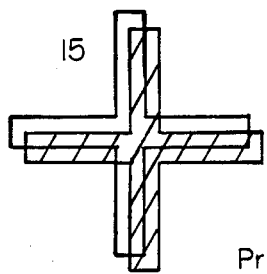
FIG. 5a depicts a slightly misaligned image projected from mask 1 onto wafer 4 near alignment target 15.
Figure 5B:
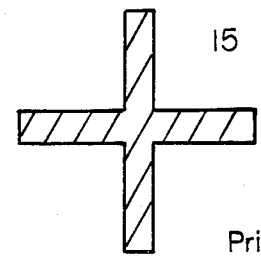
FIG. 5b depicts a properly aligned image reflected from mask 1 onto wafer 4 aligned with alignment target 15.
Figure 6:
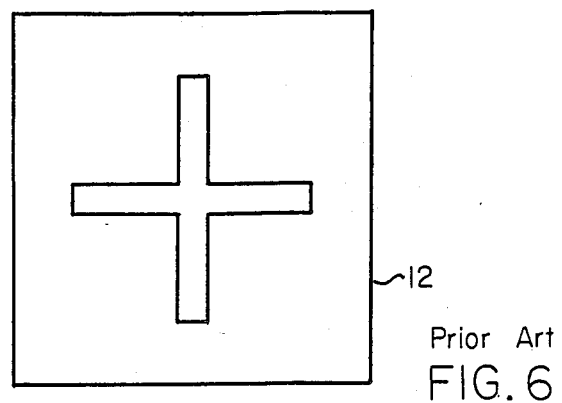
FIG. 6 is a diagram depicting alignment target mask 12 of FIG. 1.
Figure 8:
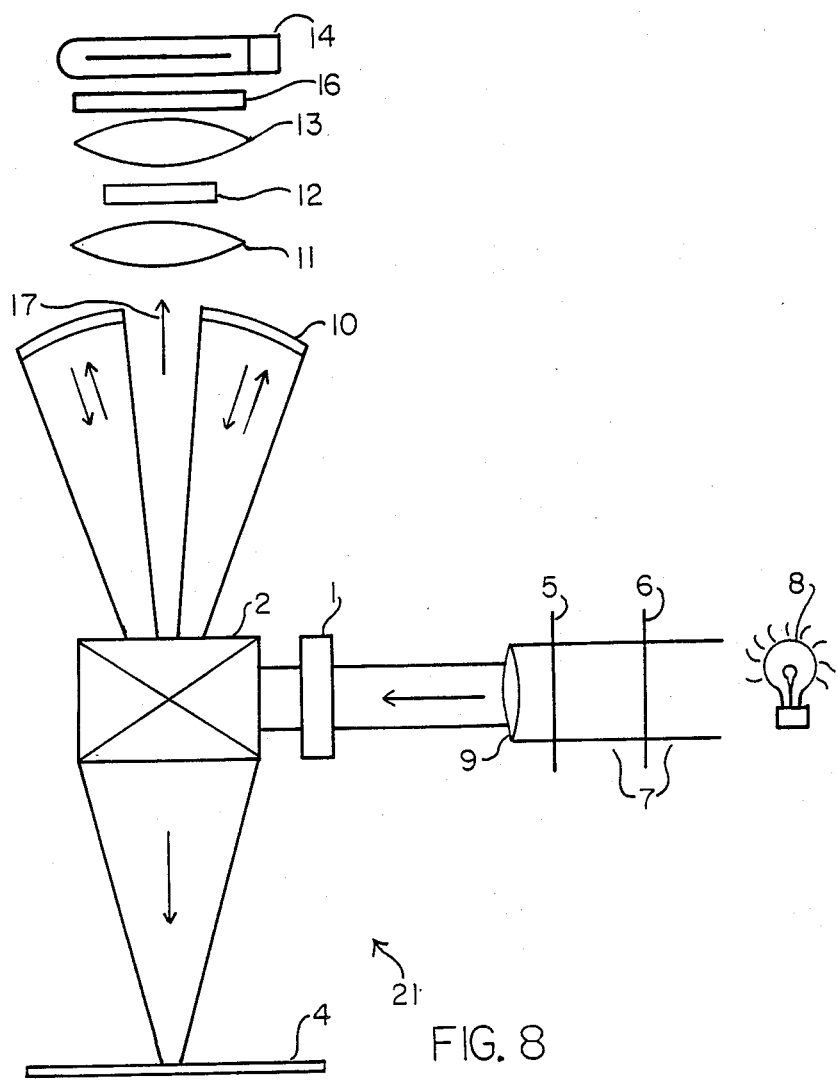
FIG. 8 is a diagram depicting one embodiment of this invention.

FIG. 8 is a diagram depicting one embodiment of a photolithographic projection stepper constructed in accordance with this invention. Components in the embodiment of FIG. 8 function in the same manner as components having corresponding reference numbers in FIG. 1. In the structure shown in FIG. 8, an image reflected from alignment target 15 (FIG. 2) on wafer 4 passes through aperture 17, lens 11, aperture mask 12, lens 13, and filter 16, to photomultiplier tube 14. In one embodiment of this invention, filter 16 is a magenta photographic filter such as a Kodak Wratten #31, 32, 33 or 34 filter. Filter 16 filters out light waves having wavelengths of less than 450 nanometers and greater than 560 nanometers. Therefore, standing waves generated when the alignment system shown in FIG. 8 is used to align a wafer having a layer of metal underneath a layer of photoresist which are caused by wavelengths less than 450 nanometers or greater than 560 nanometers are filtered out, and thus not presented to photomultiplier tube 14.

Empirical evidence has shown that a photoresist layer having a thickness of approximately 17,000 angstroms creates standing waves of light having wavelengths in the range of 560 to 600 nanometers. Photoresist layers of other thicknesses will generate standing waves of light of associated wavelengths, and thus require the use of a filter to filter out the standing waves, whatever their wavelengths might be. If a selected thickness of photoresist creates standing waves of light having wavelengths between 450 and 560 nanometers, the thickness of the photoresist is preferably adjusted slightly to a thickness which does not create standing waves of light having wavelengths between 450 and 560 nanometers, but provides a layer of photoresist of substantially desired thickness. In this manner, the use of a magenta filter in accordance with the teachings of this invention removes standing waves for substantially all thicknesses of photoresist.

Use of a magenta filter in accordance with this invention to filter the light which generates the alignment signal greatly enhances the difference in magnitude between the alignment signal when the mask and wafer are properly aligned and the alignment signal when the mask and wafer are misaligned by eliminating most standing waves which often cause erroneous alignment signals. Thus an alignment system constructed in accordance with this invention filters the light reflected from alignment target 15 on wafer 4 to limit this light to the wavelengths provided by light source 8 through actinic shutter 5 which do not generate standing waves.

By enhancing the difference between the aligned and misaligned signals, alignment is more accurately performed because the background noise and distortion of the alignment signal produced by photomultiplier tube 14 in response to standing waves is minimized, thereby decreasing the number of integrated circuits discarded because of improper alignment during the photolithographic process.

Figure 7A:
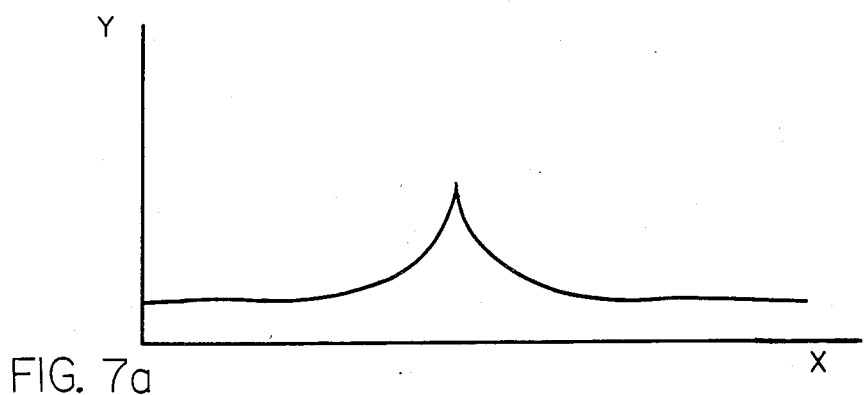
FIGS. 7a and 7b are diagrams depicting an ideal alignment signal and an actual alignment signal produced by a photolithographic projection stepper such as photolithographic projection stepper 20 of FIG. 1.
Figure 7B:
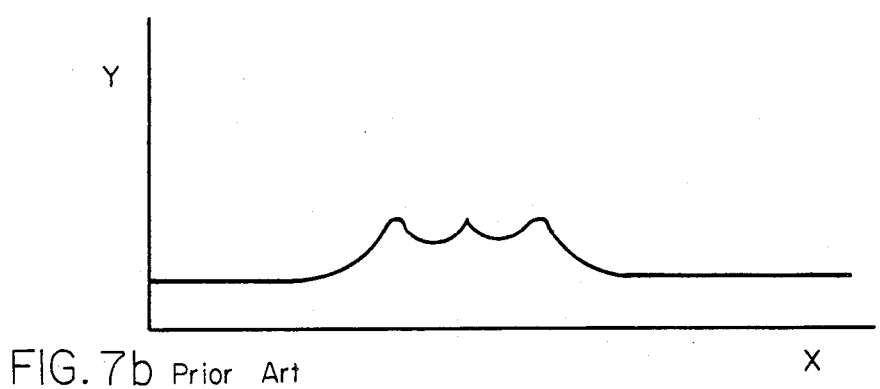
Figure 9:
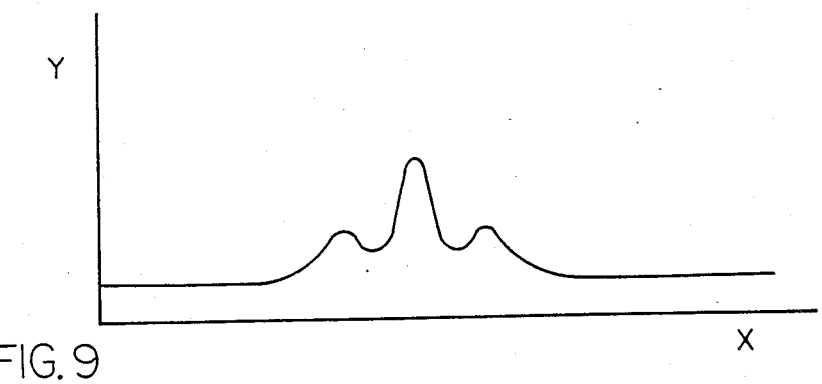
FIG. 9 is a diagram depicting an actual alignment signal provided by a photolithographic projection stepper such as photolithographic projection stepper 21.

FIG. 9 is a diagram depicting a typical alignment signal provided by photomultiplier tube 14 in FIG. 8 when photolithographic projection stepper 21 is aligning a wafer 4 on which is formed a metal layer covered with photoresist. Photolithographic projection stepper 21, which is one embodiment of this invention, produces an alignment signal much closer to the ideal alignment signal depicted in FIG. 7a. The operator of photolithographic projection stepper 21 is provided with a clearly predominant peak which clearly indicates proper alignment, unlike the ambiguous signal of prior art photolithographic stepper 20 (FIG. 1) depicted in FIG. 7b.

While this specification illustrates the specific embodiments of this invention, it is not to be interpreted as limiting the scope of the invention. Other embodiments of this invention will become evident to those of ordinary skill in the art in light of the teachings of this specification.

We claim:

1. A photolithographic mask alignment system comprising:
    means for generating an alignment image comprising a light source and an alignment mask bearing the pattern of said alignment image through which passes light from said light source;
    an alignment target bearing the pattern of said alignment image formed on a semiconductor wafer, where said semiconductor wafer is aligned with said photolithographic mask when said alignment image formed by light passed by said alignment mask is aligned with said alignment target;
    means for causing light reflected from said alignment target to have higher intensity when said alignment image is aligned with said alignment target than when said alignment image is not aligned;
    means for filtering said light after reflection from said alignment target thereby removing selected wavelengths of said light which generate standing waves upon reflection from photoresist formed upon said target; and
    means for receiving said light reflected from said alignment target after said light reflected from said alignment target has passed through said means for filtering.

2. A photolithographic alignment system as in claim 1 further comprising:
    an actinic filter for filtering said light produced by said light source.

3. A photolithographic alignment system as in claim 1 wherein said alignment target is a raised area on said semiconductor wafer having said pattern.

4. A photolithographic system as in claim 3 wherein said means for causing comprises a concave mirror having an aperture in its center, wherein only that portion of said light reflected from said alignment target which reflects from an edge of said alignment target passes through said aperture.

5. A photolithographic alignment system as in claim 1 wherein said means for receiving comprises a photomultiplier tube.

6. A method of aligning photolithographic masks in a projection photolithographic system comprising the steps of:
    generating an alignment image of a selected pattern;
    projecting said alignment image on an alignment target formed on a semiconductor wafer, said target having said selected pattern, where said semiconductor wafer is aligned with said photolithographic mask when said alignment image is aligned with said alignment target;
    filtering light reflected from the edges of said alignment target to allow filtered light having a selected range of wavelengths which do not generate standing waves to pass;
    generating an electrical signal in proportion to the received filtered light.

* * * * *